United States Patent
Chen et al.

(10) Patent No.: US 9,330,760 B2
(45) Date of Patent: May 3, 2016

(54) METHOD AND APPARATUS FOR SETTING TCAM ENTRY

(71) Applicant: Huawei Technologies Co., Ltd., Shenzhen, Guangdong (CN)

(72) Inventors: Zhiwei Chen, Nanjing (CN); Tao Chen, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 74 days.

(21) Appl. No.: 14/133,188

(22) Filed: Dec. 18, 2013

(65) Prior Publication Data
US 2014/0108718 A1    Apr. 17, 2014

Related U.S. Application Data

(63) Continuation of application No. PCT/CN2011/076593, filed on Jun. 29, 2011.

(51) Int. Cl.
    *G11C 15/04*    (2006.01)
    *H04L 12/743*   (2013.01)
    *G11C 15/00*    (2006.01)

(52) U.S. Cl.
    CPC ............... *G11C 15/04* (2013.01); *G11C 15/00* (2013.01); *H04L 45/7457* (2013.01)

(58) Field of Classification Search
    None
    See application file for complete search history.

(56) References Cited

U.S. PATENT DOCUMENTS

| | | | |
|---|---|---|---|
| 7,440,304 B1 | 10/2008 | Raj | |
| 7,624,226 B1 | 11/2009 | Venkatachary et al. | |
| 2003/0031102 A1* | 2/2003 | Narumi et al. | 369/47.3 |
| 2010/0205364 A1* | 8/2010 | Gazit | 711/108 |
| 2010/0260188 A1 | 10/2010 | Zhou | |

FOREIGN PATENT DOCUMENTS

| | | |
|---|---|---|
| CN | 101510855 A | 8/2009 |
| CN | 101866357 A | 10/2010 |

OTHER PUBLICATIONS

Wei, "Design and Implementation of Packet Classification Algorithms for NISG Fire Wall," Dissertation, China University of Geosciences for Master Degree, pp. 1-57, Beijing, China (Jun. 2007).

* cited by examiner

*Primary Examiner* — Sean D Rossiter
*Assistant Examiner* — Charles Choi
(74) *Attorney, Agent, or Firm* — Leydig, Voit & Mayer, Ltd.

(57) ABSTRACT

The present invention discloses a method and an apparatus for setting a TCAM entry and relates to the field of communications, which are used to achieve an objective of improving utilization of a TCAM. The method for setting a TCAM entry includes: acquiring a number set formed by values of same fields in preset packets, where the packets are packets on which a same action needs to be performed, and the number set includes at least two numbers; acquiring a longest continuous mask of the number set; obtaining an acquisition result according to the longest continuous mask of the number set; and storing the acquisition result in a ternary content-addressable memory TCAM entry corresponding to the action. The solutions disclosed in the present invention are applicable to a scenario of setting a TCAM entry.

12 Claims, 2 Drawing Sheets

METHOD AND APPARATUS FOR SETTING TCAM ENTRY

CROSS-REFERENCE TO RELATED APPLICATIONS

This application is a continuation of International Patent Application No. PCT/CN2011/076593, filed on Jun. 29, 2011, which is hereby incorporated by reference in its entirety.

TECHNICAL FIELD

The application relates to the field of communications, and in particular, to a method and an apparatus for setting a TCAM entry.

BACKGROUND

A TCAM (ternary content-addressable memory) is a memory for querying content based on binary numeral system, and is mainly configured to classify packets. Several entries are set in a TCAM, and an action corresponding to a TCAM entry is stored in an RAM (random-access memory). In a process of packet classification, a keyword in a packet is matched with an entry in the TCAM, and if an entry successfully matches the keyword in the packet, an action corresponding to the entry is performed on the packet.

Although using a TCAM for content query has an advantage of high efficiency, the TCAM is generally costly and power-consuming, and using a TCAM for packet classification is relatively widely applied, which leads to a shortage of TCAM resources on a network device.

In the prior art, the following three states may be used for a bit of a TCAM entry: a "0" state, a "1" state, and an "*" (Don't Care) state, where "0" and "1" may be used for exact matching, and "*" may be used for fuzzy matching. In order to save TCAM resources, a TCAM entry may be set by using "*". For example, an action 1 needs to be performed on packets with port numbers from 0 to 7 in IP packets, and a TCAM entry 1 corresponding to the action 1 may be set to "0***"; because multiple matching conditions can be represented by using one TCAM entry, utilization of the TCAM can be improved. However, the method for setting a TCAM entry is only applicable to a situation where an entry is a suffix mask, that is, the entry only includes continuous Don't Care states and the least significant bit of the entry is a Don't Care state.

SUMMARY

Embodiments of the present invention provide a method and an apparatus for setting a TCAM entry, which are used to improve utilization of a TCAM.

In order to achieve the foregoing objective, the embodiments of the present invention adopt the following technical solutions:

A method for setting a TCAM entry, including:

acquiring a number set formed by values of same fields in preset packets, where the packets are packets on which a same action needs to be performed, and the number set includes at least two numbers;

acquiring a longest continuous mask of the number set, where the method for acquiring a longest continuous mask includes: performing bitwise rotation operations on the number set to acquire all bitwise rotation operated number sets; acquiring longest suffix masks of all the bitwise rotation operated number sets; and performing a corresponding bitwise rotation inverse operation on a longest suffix mask with the largest quantity of Don't Care bits in the longest suffix masks of all the number sets to acquire the longest continuous mask;

obtaining an acquisition result according to the longest continuous mask of the number set; and storing the acquisition result in the TCAM entry corresponding to the action.

An apparatus for setting a TCAM entry, including:

a first acquisition unit, configured to acquire a number set formed by values of same fields in preset packets, where the packets are packets on which a same action needs to be performed, and the number set includes at least two numbers;

a second acquisition unit, configured to acquire a longest continuous mask of the number set, where the second acquisition unit is specifically configured to perform bitwise rotation operations on the number set to acquire all bitwise rotation operated number sets; acquire longest suffix masks of all the bitwise rotation operated number sets; and perform a corresponding bitwise rotation inverse operation on a longest suffix mask with the largest quantity of Don't Care bits in the longest suffix masks of all the number sets to acquire the longest continuous mask;

an obtaining unit, configured to obtain an acquisition result according to the longest continuous mask of the number set; and a storage unit, configured to store the acquisition result in the TCAM entry corresponding to the action.

According to the method and the apparatus for setting a TCAM entry that are provided in the embodiments of the present invention, a longest continuous mask of a number set formed by values of same fields in preset packets can be obtained by using the method for acquiring a longest continuous mask, and a TCAM entry is set according to the longest continuous mask, so as to further improve utilization of a TCAM, thereby saving TCAM resources.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
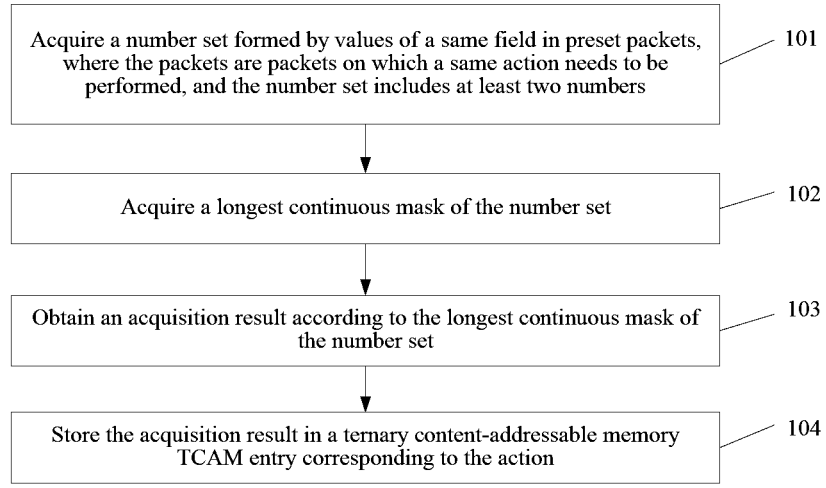
FIG. 1 is a flowchart of a method for setting a TCAM entry according to an embodiment of the present invention.

In order to improve utilization of a TCAM, as shown in FIG. 1, an embodiment of the present invention provides a method for setting a TCAM entry, which includes the following steps:

101: Acquire a number set formed by values of a same field in preset packets, where the packets are packets on which a same action needs to be performed, and the number set includes at least two numbers.

Taking an application of an ACL (access control list) as an example, each of the packets includes one or more of the following fields: a source IP address, a destination IP address, a protocol number, a source port number, and a destination port number. The action includes forwarding, discarding, redirection, modification, traffic limiting, and so on. For example, presets that a same action, e.g. discarding, needs to be performed on packets for which values of source port numbers are 4, 5, 6, 7, 12, 13, 14, and 15; therefore, a number set formed by values of a same field, that is, source port number field, in the preset packets is {4, 5, 6, 7, 12, 13, 14, 15}. Generally, a machine can identify a binary number, and for convenience of description, in this embodiment, a number in the number set is represented in the decimal system.

102: Acquire a longest continuous mask of the number set.

The following three states may be used for a bit of a TCAM entry: a "0" state, a "1" state, and an "*" (Don't Care) state, where "0" and "1" may be used for exact matching, and "*" may be used for fuzzy matching. An entry represented by using these three states is a mask. A mask of a number set is any element in a mask set of the number set. A mask set of a number set refers to a group of masks that can match all elements in the number set and do not match any number except the elements in the number set. A number set may have multiple mask sets, for example, a mask set of a number set {4, 5, 6} may be {100, 101, 110}, {1*0, 101}, or {10*, 110}. Therefore, a mask of the number set {4, 5, 6} may be 100, 101, 110, 1*0, or 10*.

If a Don't Care bit of a mask is continuous, or the Don't Care bit of the mask is continuous by performing a bitwise rotation operation, the mask is called a continuous mask; otherwise, the mask is called a discontinuous mask. If a mask has only one Don't Care bit, the mask may also be called a continuous mask. When multiple masks exist, a continuous mask with the largest quantity of Don't Care bits is a longest continuous mask.

The bitwise rotation operation includes a bitwise left rotation operation and a bitwise right rotation operation. Bitwise left rotating by i (i≥0) bits refers to that bits except i most significant bits of a binary number or a mask are shifted by i bits to the left successively, and the most significant i bits are correspondingly shifted to i least significant bits. Similarly, bitwise right rotating by j (j≥0) bits refers to that bits except j least significant bits of a binary number or a mask are shifted by j bits to the right successively, and the j least significant bits are correspondingly shifted to most significant j bits.

The longest continuous mask may be acquired in the following manner

A bitwise rotation operation is performed on the number set to acquire all bitwise rotation operated number sets. Performing a bitwise rotation operation on a number set refers to that a same bitwise rotation operation is performed on each element in the number set, for example, bitwise left rotation by i bits is performed on each element in the number set. The bitwise rotation operated number set may include a zero bit bitwise rotated number set, that is, a number set of which a value of each element is the same as that of each element in an original number set. All the bitwise rotation operated number sets refer to number sets obtained by performing all possible bitwise rotation operations on the original number set. All the possible bitwise rotation operations may be all bitwise rotation operations that do not include an equivalent operation. The equivalent operation refers to that if numbers or number sets that are obtained by performing two bitwise rotation operations on arbitrary number or number set are the same, these two bitwise rotation operations are equivalent operations. For example, for a binary number with four bits, bitwise left rotation by 2 bits and bitwise right rotation by 2 bits are equivalent operations.

Longest suffix masks of all the bitwise rotation operated number sets are acquired. If a Don't Care bit in a mask is continuous and a least significant bit of the mask is in a Don't Care state, the mask is called a suffix mask, for example, 00**. When multiple masks are compared, a suffix mask with the largest quantity of Don't Care bits is a longest suffix mask. To acquire the longest suffix masks of all the bitwise rotation operated number sets, each longest suffix mask of each bitwise rotation operated number set can be obtained, and the longest suffix masks of all the bitwise rotation operated number sets are obtained according to the longest suffix mask of each number set. Alternatively, all suffix masks of all the bitwise rotation operated number sets are acquired, and the longest suffix masks of all the number sets are obtained from all the suffix masks. A suffix mask of a number set may be acquired by using a common method. When more than one suffix mask with the largest quantity of Don't Care bits exists, any of the more than one suffix mask may be selected as a longest suffix mask of all the bitwise rotation operated number sets.

A corresponding bitwise rotation inverse operation is performed on a longest suffix mask with the largest quantity of Don't Care bits in the longest suffix masks of all the number sets to acquire the longest continuous mask. If number or number set that are obtained by successively performing two bitwise rotation operations on an arbitrary number or number set are the same as an original number or original number set, these two bitwise rotation operations are inverse operations to each other, that is, one of them is a bitwise rotation inverse operation for the other. For example, a bitwise rotation inverse operation for bitwise left rotation by 1 bit is bitwise right rotation by 1 bit. The corresponding bitwise rotation inverse operation refers to an inverse operation of the bitwise rotation operation on the bitwise rotation operated number set corresponding to the longest suffix mask obtained from the number set.

An example is taken in the following to illustrate a specific application scenario of acquiring a longest continuous mask according to an embodiment of the present invention.

First, a bitwise rotation operation is performed on the number set obtained in step 101 to obtain intermediate number sets whose quantity is the largest quantity of bits. The largest quantity of bits may refer to the quantity of bits that is used by a largest number in the number set represented in the binary system, or refer to the quantity of bits that is preset according to actual requirements. For example, for the number set {4, 5, 6, 7, 12, 13, 14, 15}, because the largest number in the number set is 15, the largest quantity of bits may be 4 or preset to any value greater than 4, for example, 8 or 16. For convenience of description, in this embodiment, each number in the number set is represented by a binary number with 4 bits; therefore, each number in the number set is represented as {0100b, 0101b, 0110b, 0111b, 1100b, 1101b, 1110b, 1111b}, where the b is an identifier of a binary number. A bitwise rotation operation is performed on each number in the number set, for example, if bitwise left rotation by 0 bit is performed, a first intermediate number set that is obtained is still the number set itself {0100b, 0101b, 0110b, 0111b, 1100b, 1101b, 1110b, 1111b}; if bitwise left rotation by 1 bit is performed, a second intermediate number set {1000b, 1010b, 1100b, 1110b, 1001b, 1011b, 1101b, 1111b} is obtained; if bitwise left rotation by 2 bits is performed, a third intermediate number set {0001b, 0101b, 1001b, 1101b, 0011b, 0111b, 1011b, 1111b} is obtained; and if bitwise left rotation by 3 bits is performed, a fourth intermediate number set {0010b, 1010b, 0011b, 1011b, 0110b, 1110b, 0111b, 1111b} is obtained.

Then, longest suffix masks of all intermediate number sets are acquired.

A longest suffix mask of a number set may be obtained by using a common method.

For example, starting from a suffix mask whose bits are all Don't Care bits, each suffix mask is traversed in descending order of the quantities of the Don't Care bits, so as to check whether the suffix mask is a mask of the number set, until a suffix mask being the mask of the number set is found, and the suffix mask is the longest suffix mask of the number set. For example, for a number set formed by numbers with three bits, whether the suffix mask is the mask of the number set is successively checked in the order of "*", "0", "1**", "00*", "01*", "10*", "11*", "000", "001", "010", "011", "100", "101", "110", and "111", until a suffix mask, for example, "01*", which is the mask of the number set, is found, and "01*" is the longest suffix mask of the number set. Optionally, when none of the suffix masks including a Don't Care bit is the mask of the number set, finding may also be stopped, and a value of any element in the number set is selected as the longest suffix mask.

The suffix mask may also be obtained by using a binary tree principle.

In this step, an example where the first intermediate number set {0100b, 0101b, 0110b, 0111b, 1100b, 1101b, 1110b, 1111b}, that is, {4, 5, 6, 7, 12, 13, 14, 15}, is acquired is taken to introduce the method for acquiring a longest suffix mask.

The method for acquiring a longest suffix mask of an intermediate number set may be implemented by using the binary tree principle:

(1) A structure of a binary tree may be constructed in a software or hardware manner. Each node in the binary tree corresponds to one address in a memory, and each node is connected to two child nodes, so that the node is called a parent node of these two child nodes. A connection relationship between the parent node and the child nodes may be implemented by using a pointing relationship between addresses in the memory, for example, addresses of the two child nodes of the parent node are stored in the parent node, and an address of the parent node of the child nodes is stored in the child nodes. A value of each bit of a binary number may be represented by a location corresponding to the bit in a binary tree, for example, in this embodiment, the left child node of the parent node corresponds to a binary number "0", and the right child node corresponds to a binary number "1". An initial parent node in the binary tree does not correspond to any binary number, and the initial parent node is called a root node of the binary tree. Each layer under the root node of the binary tree successively corresponds to a bit of a binary number, and each layer of the binary tree from top to bottom successively corresponds to each bit of a binary number from high to low. For example, four layers in a binary tree constructed in FIG. 2 may correspond to a binary number with four bits, such as $A_3A_2A_1A_0$, where a first layer corresponds to the most significant bit $A_3$ of the binary number, and a fourth layer corresponds to the least significant bit $A_0$ of the binary number.

(2) A node corresponding to each number in the intermediate number set at the lowest layer of the binary tree is queried, and the node is set to "1".

Figure 2:
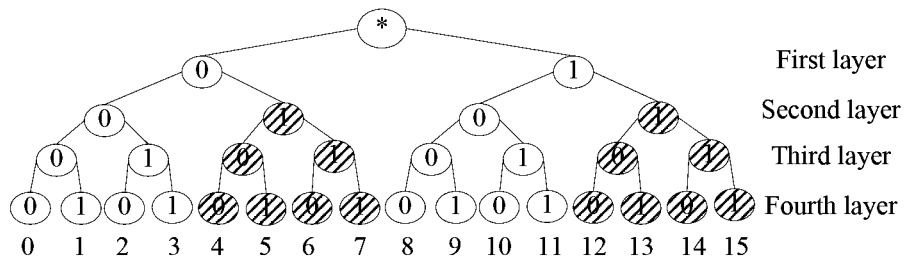
FIG. 2 is a first schematic diagram of a method for acquiring a longest suffix mask by using a binary tree according to an embodiment of the present invention.

For example, in FIG. 2, for a number 4 (that is, 0100b) in the number set {4, 5, 6, 7, 12, 13, 14, 15}, query starts from a root node of the binary tree, and it can be obtained successively that the 0100b corresponds to a left node at the first layer, corresponds to a right node at a second layer, corresponds to a left node at a third layer, and corresponds to a left node at the fourth layer; therefore, a node, which corresponds to 0100b, at the lowest layer of the binary tree is obtained, and the node may be set to "1", that is, a value stored for an address in the memory that corresponds to the node is set to "1", so as to represent that the node corresponds to a number in the intermediate number set. It should be noted that, an initial value of each node is "0". In binary trees in all embodiments of the present invention, a circle with a blank background represents a node with a value of 0, and a circle with a twill background represents a node with a value of 1.

(3) The lowest layer of the binary tree is traversed, and an AND operation is performed on values of every two child nodes having a same parent node; and if a result of the AND operation on values of two child nodes is 1, a value of the parent node of the two child nodes is set to 1; otherwise, it is still 0.

For example, in FIG. 2, a value of a node at the third layer of the binary tree is obtained.

(4) Each layer of the binary tree is successively traversed upwards to obtain a value of a node at each layer of the binary tree.

For example, in FIG. 2, values of nodes at the second layer and the first layer are obtained.

(5) If a value of a node at a layer is 1, a bit corresponding to each layer under the layer (excluding the layer) is represented by using a Don't Care ("*") state, and bits corresponding to the layer and a layer above the layer are represented by using "0" or "1", so as to obtain a suffix mask used to represent the intermediate number set. If values of multiple nodes at a layer are 1, multiple suffix masks used to represent the intermediate number set can be obtained.

For example, in FIG. 2, two nodes with the values of 1 exist at the second layer, and for nodes corresponding to 4, 5, 6, and 7 at the second layer, bits corresponding to layers under a layer where the nodes are located, that is, the third layer and the fourth layer, are represented by using "*", and bits corresponding to the layer where the nodes are located and a layer above the layer are represented by using "0" or "1", so as to obtain a suffix mask 01 used to represent 4, 5, 6, and 7. Similarly, for nodes corresponding to 12, 13, 14, and 15 at the second layer, a suffix mask 11 used to represent the four numbers can be obtained.

(6) A suffix mask with the largest quantity of Don't Care bits is selected from the at least one suffix mask as the longest suffix mask of the intermediate number set.

It should be noted that, if the quantity of the at least one suffix mask is one, the one suffix mask is the longest suffix mask; if the quantity of the at least one suffix mask is at least two, and more than one suffix mask with the largest quantity of Don't Care bits exists in the at least two suffix masks, any one of the more than one suffix mask is selected as the longest suffix mask.

For example, in FIG. 2, two suffix masks 01 and 11 are obtained, and apparently, the quantities of Don't Care bits of the two suffix masks are both two; therefore, either suffix mask, for example, 01**, is selected as the longest suffix mask of the first intermediate number set, and the quantity of Don't Care bits of the longest suffix mask is 2.

Figure 3:
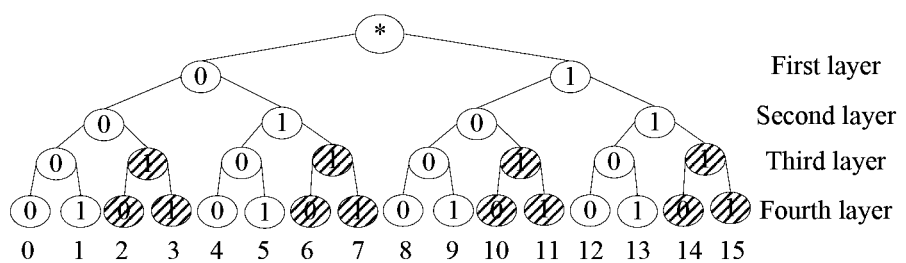
FIG. 3 is a second schematic diagram of a method for acquiring a longest suffix mask by using a binary tree according to an embodiment of the present invention.

Similarly, as shown in FIG. 3, a longest suffix mask 001* of the fourth intermediate number set is obtained, and the quantity of Don't Care bits is 1.

Figure 4:
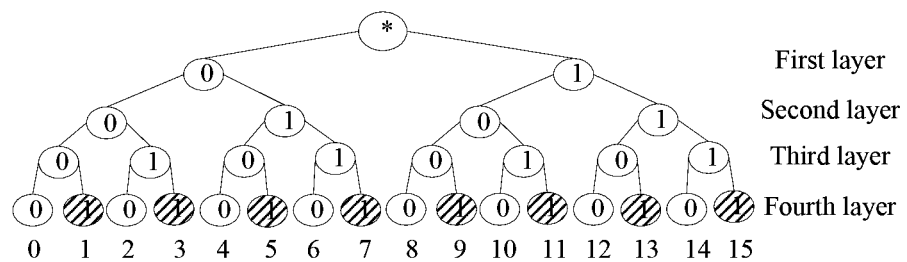
FIG. 4 is a third schematic diagram of a method for acquiring a longest suffix mask by using a binary tree according to an embodiment of the present invention.

As shown in FIG. 4, a longest suffix mask 0001 of the third intermediate number set is obtained, and the quantity of Don't Care bits is 0.

Figure 5:
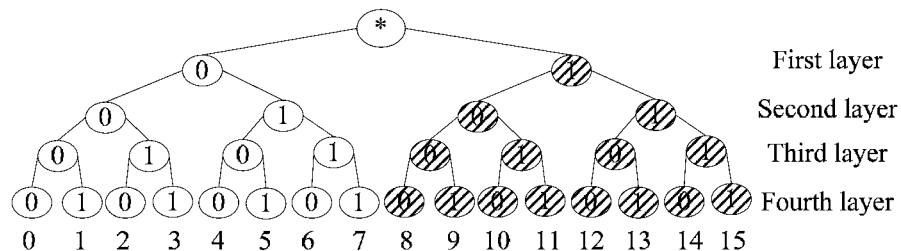
FIG. 5 is a fourth schematic diagram of a method for acquiring a longest suffix mask by using a binary tree according to an embodiment of the present invention.

As shown in FIG. 5, a longest suffix mask 1*** of the second intermediate number set is obtained, and the quantity of Don't Care bits is 3.

Finally, a longest suffix mask with the largest quantity of Don't Care bits is selected from the longest suffix masks of all the intermediate number sets as a final longest suffix mask, and the longest continuous mask of the number set is obtained according to an inverse operation of a bitwise rotation operation for obtaining the intermediate number set corresponding to the final longest suffix mask.

For example, for the number set {4, 5, 6, 7, 12, 13, 14, 15}, because the quantity of Don't Care bits of the longest suffix mask 1* of the second intermediate number set of the number set is 3, and apparently, the quantity of Don't Care bits of the longest suffix mask is largest, 1* is used as the final longest suffix mask. In addition, the process of obtaining the second intermediate number set is that bitwise left rotation by 1 bit is performed on each number in the number set, and at this time, for 1***, a longest continuous mask *1 of the number set needs to be obtained according to a bitwise rotation inverse operation, that is, bitwise right rotation by 1 bit, on 1*.

103: Obtain an acquisition result according to the longest continuous mask of the number set.

Step 103 may specifically be: using a mask set formed by the longest continuous mask of the number set and an element in a remaining number set of the number set for the longest continuous mask as the acquisition result.

A remaining number set of a number set for a mask refers to a number set formed by remaining numbers by removing a number represented by the mask in the number set.

For example, for the number set {4, 5, 6, 7, 12, 13, 14, 15}, the longest continuous mask of the number set is *1**, and a remaining number set of the number set for the longest continuous mask is an empty set, so the obtained acquisition result is {*1**}.

Alternatively, step 103 may also specifically be: if the length of the longest continuous mask of the number set is not 0, loop to acquire a remaining number set of a number set for a longest continuous mask of the number set and a longest continuous mask of the remaining number set, until the remaining number set is empty or the length of the longest continuous mask of the remaining number set is 0; and using a mask set formed by all obtained longest continuous masks, that is, the longest continuous mask of the number set and a longest continuous mask of each remaining number set obtained before the looping ends, and an element in a last remaining number set as the acquisition result. The last remaining number set refers to a remaining number set finally obtained in the foregoing looping.

The step may specifically be: acquiring a remaining number set of the number set for the longest continuous mask, and acquiring a longest continuous mask of the remaining number set; and if the length of the longest continuous mask of the remaining number set is not 0, continuing to acquire a remaining number set of the remaining number set for the longest continuous mask of the remaining number set, and looping like this, until an obtained remaining number set is an empty set or the length of the longest continuous mask of the remaining number set is 0. The mask set formed by all the longest continuous masks obtained in the foregoing process and the element in the obtained last remaining number set is used as the acquisition result.

The length of a mask refers to the quantity of Don't Care bits in the mask. For example, the length of the longest continuous mask refers to the quantity of Don't Care bits in the longest continuous mask.

For example, for a number set {0, 1, 4, 5, 6, 7, 12, 13}, a longest continuous mask of the number set is 01**, a remaining number set of the number set for the longest continuous mask of the number set is {0, 1, 12, 13}, and {0, 1, 12, 13} may be called a first remaining number set. A longest suffix mask of the first remaining number set is 000*, and a remaining number set of the first remaining number set for a longest continuous mask of the first remaining number set is {12, 13}, and {12, 13} may be called a second remaining number set. A longest continuous mask of the second remaining number set is 110*, and a remaining number set of the second remaining number set for the longest continuous mask of the second remaining number set is an empty set; at this time, the looping ends, and an obtained last remaining number set is an empty set. All longest continuous masks includes: 01**, 000*, and 110*, and the last remaining number set is an empty set; therefore, {01**, 000*, 110*} may be used as the acquisition result.

Alternatively, step 103 may also specifically be: if the length of the longest continuous mask of the number set is not 0, looping to acquire a remaining number set of a number set for a longest continuous mask of the number set and a longest continuous mask of the remaining number set, until the remaining number set is empty or the length of the longest continuous mask of the remaining number set is 0; combining at least two continuous masks having an identical Don't Care bit in a mask set formed by all obtained longest continuous masks, that is, the longest continuous mask of the number set and a longest continuous mask of each remaining number set obtained before the looping ends, so as to obtain a combined mask set; and using a mask set formed by the element in a last remaining number set and the element in the combined mask set as the acquisition result. The last remaining number set refers to a remaining number set finally obtained in the foregoing looping process. The combination may be performed for only once, or repeatedly performed until the combination cannot be performed.

The process of acquiring all the longest continuous masks may be the same as that in the foregoing description, which is not elaborated herein.

The at least two continuous masks having an identical Don't Care bit refer to that locations of all Don't Care bits in the at least two continuous masks are completely consistent. For example, all Don't Care bits of *11**, *10**, and *01** are in first, fourth, and fifth bits from left to right; therefore, *11**, *10**, and *01** have identical Don't Care bits.

The process of combining the at least two continuous masks having the identical Don't Care bit in the mask set formed by all the obtained longest continuous masks to obtain a combination result may include the following steps.

First, replace the identical Don't Care bit in at least two longest continuous masks having the identical Don't Care bit in the mask set with a same state combination of "0" and "1" to obtain at least two binary numbers.

For example, the at least two longest continuous masks having the identical Don't Care bit are 011 and 001; therefore, the identical Don't Care bit is replaced with a same state of "0" or "1", for example, two continuous Don't Care bits may be replaced with 00 to obtain two binary numbers: 01100 and 00100. These two bits may also be replaced with 01, 10, or 11.

Second, the at least two binary numbers form a number set, and a longest continuous mask of the number set is acquired as a standby longest continuous mask.

For example, binary numbers 01100 and 00100 form a number set {01100b, 00100b}, and a longest continuous mask of the number set is acquired as the standby longest continuous mask. The longest continuous mask 0*100 of the number set may be obtained as the standby longest continuous mask according to the method for acquiring a longest continuous mask that is introduced in step 102. If the length of the longest continuous mask obtained in this step is 0, a result of combining the at least two continuous masks having the identical Don't Care bit is the same as that of the at least two continuous masks that originally need to be combined, and optionally, the combination may be terminated at this time.

Finally, perform mask replacement on the standby longest continuous mask by using any one of the at least two longest continuous masks having the identical Don't Care bit to obtain a replacement result. The replacement result and an element that cannot be represented by the replacement result in the mask set form a combined mask set, and the combined mask set is a combination result. Any one of the at least two longest continuous masks having the identical Don't Care bit is a replacer, and the standby longest continuous mask is a replaced party.

In an actual implementation, because a machine can only identify a binary number of 0 or 1, representation of each mask is represented or calculated in the binary system in an actual machine, and the mask may be represented by a binary number and a positive mask or represented by a binary number and an inverse mask. For a positive mask, 1 is used to represent care, and 0 is used to represent Don't Care; on the contrary, for an inverse mask, 0 is used to represent care, and 1 is used to represent Don't Care.

If the longest continuous mask on which a replacement operation is performed is relevant to the standby longest continuous mask, that is, the standby longest continuous mask may represent a binary number of the longest continuous mask on which the replacement operation is performed, the standby longest continuous mask may also be a replacer.

When a mask is represented by a binary number and a positive mask, the mask replacement is positive mask replacement. When a mask is represented by a binary number and an inverse mask, the mask replacement is inverse mask replacement. The inverse mask replacement includes: representing either of a replacer and a replaced party by a binary number and an inverse mask, performing a bitwise OR operation on two inverse masks of the replacer and the replaced party, and forming a mask by a result of the bitwise OR operation and a binary number of the replaced party. The positive mask replacement includes: representing a replacer and a replaced party by a binary number and a positive mask each, performing a bitwise AND operation on two positive masks of the replacer and the replaced party, and forming a mask by a result of the bitwise AND operation and a binary number of the replaced party.

An example where the inverse mask replacement is performed to obtain the combination result is taken for description in the following.

A standby longest continuous mask is, for example, 0*100, and any one of the at least two longest continuous masks having the identical Don't Care bit is, for example, 011. 011 is a replacer, and 0*100 is a replaced party. 0*100 may be represented, by a binary number and an inverse mask, as a binary number 00100 and an inverse mask 01000, and 011** may be represented, by a binary number and an inverse mask, as a binary number 01100 and an inverse mask 00011. A bitwise OR operation is performed on the two inverse masks 01000 and 00011 to obtain an inverse mask 01011, and the inverse mask 01011 and the binary number 00100 of the replaced party form a discontinuous mask 0*1. Through the foregoing operations, the masks 011 and 001** are combined into 0*1**. No mask that cannot be represented by 0*1 exists in a mask set {011, 001}; therefore, the mask set {011, 001**} is combined into {0*1**}.

Furthermore, the combination result includes a discontinuous mask, and at least two discontinuous masks have an identical Don't Care bit; therefore, the at least two discontinuous masks may be combined to obtain a combination result.

For example, if obtained discontinuous masks are 000*0** and 010*0**, with reference to the foregoing combination method, a combined mask 0*0*0** may be obtained, and {0*0*0**} is used as the combination result.

104: Store the acquisition result in a TCAM entry corresponding to the action.

In this embodiment, the foregoing steps may be performed by an apparatus for setting a TCAM entry. Because each step in the foregoing steps may be implemented by a hardware logic, the apparatus may be implemented by software or hardware in a network device. For example, if the apparatus is implemented by hardware, the apparatus may be specifically implemented by an application-specific integrated circuit (ASIC), a complex programmable logical device (CPLD), or a field-programmable gate array (FPGA). If the apparatus is implemented by software, under the control of an operating system of the router, a mask is obtained by the software through the foregoing steps, and the obtained mask is delivered by a driver in the software to a TCAM entry.

According to the method for setting a TCAM entry that is provided in the embodiment of the present invention, a longest continuous mask of a number set formed by values of same fields of preset packets can be obtained by using the method for acquiring a longest continuous mask, and a TCAM entry is set according to the longest continuous mask, so as to further improve utilization of a TCAM, thereby saving TCAM resources.

Figure 6:
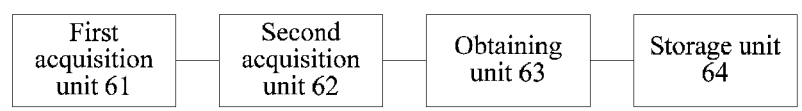
FIG. 6 is a structural block diagram of an apparatus for setting a TCAM entry according to an embodiment of the present invention.

As shown in FIG. 6, an embodiment of the present invention provides a setting apparatus corresponding to the foregoing method for setting a TCAM entry, where the setting apparatus includes: a first acquisition unit 61, a second acquisition unit 62, an obtaining unit 63, and a storage unit 64.

The first acquisition unit 61 is configured to acquire a number set formed by values of same fields in preset packets, where the packets are packets on which a same action needs to be performed, and the number set includes at least two numbers.

Taking an application of an ACL (access control list) as an example, each of the packet includes one or more of the following fields: a source IP address, a destination IP address, a protocol number, a source port number, and a destination port number. The action includes: forwarding, discarding, redirection, modification, traffic limiting, and so on. For example, a same action, for example, discarding, needs to be performed on packets for which values of source port numbers are preset to 4, 5, 6, 7, 12, 13, 14, and 15; therefore, a number set formed by values of same fields, that is, source port number fields, in the preset packets is {4, 5, 6, 7, 12, 13, 14, 15}. Generally, a machine can identify a binary number, and for convenience of description, in this embodiment, a number in the number set is represented in the decimal system.

The second acquisition unit 62 is configured to acquire a longest continuous mask of the number set, where the second acquisition unit 62 is specifically configured to perform a bitwise rotation operation on the number set to acquire all bitwise rotation operated number sets; acquire longest suffix masks of all the bitwise rotation operated number sets; and perform a corresponding bitwise rotation inverse operation on a longest suffix mask with the largest quantity of Don't Care bits in the longest suffix masks of all the number sets to acquire the longest continuous mask.

The following three states may be used for a bit of a TCAM entry: a "0" state, a "1" state, and an "*" (Don't Care) state, where "0" and "1" may be used for exact matching, and "*" may be used for fuzzy matching. An entry represented by using these three states is a mask. A mask of a number set is any element in a mask set of the number set. A mask set of a number set refers to a group of masks that can match all elements in the number set and do not match any number except the elements in the number set. A number set may have multiple mask sets, for example, a mask set of a number set {4, 5, 6} may be {100, 101, 110}, {1*0, 101}, or {10*, 110}. Therefore, a mask of the number set {4, 5, 6} may be 100, 101, 110, 1*0, or 10*.

If a Don't Care bit of a mask is continuous, or the Don't Care bit of the mask is continuous by performing a bitwise rotation operation, the mask is called a continuous mask; otherwise, the mask is called a discontinuous mask. If a mask has only one Don't Care bit, the mask may also be called a continuous mask. When multiple masks exist, a continuous mask with the largest quantity of Don't Care bits is a longest continuous mask.

The bitwise rotation operation includes a bitwise left rotation operation and a bitwise right rotation operation. Bitwise left rotation by i (i≥0) bits refers to that bits except most significant i bits of a binary number or a mask are shifted by i bits to the left successively, and the most significant i bits are correspondingly shifted to least significant i bits. Similarly, bitwise right rotation by j (j≥0) bits refers to that bits except least significant j bits of a binary number or a mask are shifted by j bits to the right successively, and the least significant j bits are correspondingly shifted to most significant j bits.

The longest continuous mask may be acquired in the following manner

A bitwise rotation operation is performed on the number set to acquire all bitwise rotation operated number sets. Performing a bitwise rotation operation on a number set refers to that a same bitwise rotation operation is performed on each element in the number set, for example, bitwise left rotation by i bits is performed on each element in the number set. The bitwise rotation operated number set may include a number set by performing bitwise rotation by zero bit, that is, a number set of which a value of each element is the same as that of each element in an original number set. All the bitwise rotation operated number sets refer to number sets obtained by performing all possible bitwise rotation operations on an original number set. All the possible bitwise rotation operations may be all bitwise rotation operations excluding an equivalent operation. The equivalent operation refers to that if numbers or number sets that are obtained by performing two bitwise rotation operations on arbitrary number or number set are the same, these two bitwise rotation operations are equivalent operations. For example, for a binary number with four bits, bitwise left rotation by 2 bits and bitwise right rotation by 2 bits are equivalent operations.

Longest suffix masks of all the bitwise rotation operated number sets are acquired. If a Don't Care bit in a mask is continuous and a least significant bit of the mask is in a Don't Care state, the mask is called a suffix mask, for example, 00**. When multiple masks are compared, a suffix mask with the largest quantity of Don't Care bits is a longest suffix mask. During acquisition of the longest suffix masks of all the bitwise rotation operated number sets, each longest suffix mask of each bitwise rotation operated number set can be separately obtained, and the longest suffix masks of all the bitwise rotation operated number sets are obtained according to the longest suffix mask of each number set. All suffix masks of all the bitwise rotation operated number sets may also be acquired, and the longest suffix masks of all the number sets are obtained from all the suffix masks. A suffix mask of a number set may be acquired by using a common method. When more than one suffix mask with the largest quantity of Don't Care bits exists, any of the more than one suffix mask may be selected as a longest suffix mask of all the bitwise rotation operated number sets.

A corresponding bitwise rotation inverse operation is performed on a longest suffix mask with the largest quantity of Don't Care bits in the longest suffix masks of all the number sets to acquire the longest continuous mask. If numbers or number sets that are obtained by successively performing two bitwise rotation operations on arbitrary number or number set are the same as an original number or original number set, these two bitwise rotation operations are inverse operations relative to each other, that is, one of them is a bitwise rotation inverse operation for the other. For example, a bitwise rotation inverse operation for bitwise left rotation by 1 bit is bitwise right rotation by 1 bit. The corresponding bitwise rotation inverse operation refers to an inverse operation of a bitwise rotation operation on the bitwise rotation operated number set corresponding to the longest suffix mask obtained from the number set.

An example is taken in the following to illustrate a specific application scenario of acquiring a longest continuous mask according to an embodiment of the present invention.

First, a bitwise rotation operation is performed on the number set obtained by the first acquisition unit 61 to obtain intermediate number sets whose quantity is the largest quantity of bits. The largest quantity of bits may refer to the quantity of bits that is used by a largest number in the number set represented in the binary system, or refer to the quantity of bits that is preset according to actual requirements. For example, for the number set {4, 5, 6, 7, 12, 13, 14, 15}, because the largest number in the number set is 15, the largest quantity of bits may be 4 or preset to any value greater than 4, for example, 8 or 16. For convenience of description, in this embodiment, each number in the number set is represented by a binary number with 4 bits; therefore, each number in the number set is represented as {0100b, 0101b, 0110b, 0111b, 1100b, 1101b, 1110b, 1111b}, where the b is an identifier of a binary number. A bitwise rotation operation is performed on each number in the number set, for example, if bitwise left rotation by 0 bit is performed, a first intermediate number set that is obtained is still the number set itself {0100b, 0101b, 0110b, 0111b, 1100b, 1101b, 1110b, 1111b}; if bitwise left rotation by 1 bit is performed, a second intermediate number set {1000b, 1010b, 1100b, 1110b, 1001b, 1011b, 1111b} is obtained; if bitwise left rotation by 2 bits is performed, a third intermediate number set {0001b, 0101b, 1001b, 1101b, 0011b, 0111b, 1011b, 1111b} is obtained; and if bitwise left rotation by 3 bits is performed, a fourth intermediate number set {0010b, 1010b, 0011b, 1011b, 0110b, 1110b, 0111b, 1111b} is obtained.

Then, longest suffix masks of all intermediate number sets are acquired.

A longest suffix mask of a number set may be obtained by using a common method.

For example, starting from a suffix mask whose bits are all Don't Care bits, each suffix mask is traversed in descending order of the quantities of the Don't Care bits, so as to check whether the suffix mask is a mask of the number set, until a suffix mask being the mask of the number set is found, and the suffix mask is the longest suffix mask of the number set. For example, for a number set formed by numbers with three bits, whether the suffix mask is the mask of the number set is successively checked in the order of "*", "0", "1**", "00*", "01*", "10*", "11*", "000", "001", "010", "011", "100", "101", "110", and "111", until a suffix mask, for example, "01*", which is the mask of the number set, is found, and "01*" is the longest suffix mask of the number set. Optionally, when none of the suffix masks including a Don't Care bit is the mask of the number set, finding may also be stopped, and a value of any element in the number set is selected as the longest suffix mask.

The suffix mask may also be obtained by using a binary tree principle.

In this step, an example where the first intermediate number set {0100b, 0101b, 0110b, 0111b, 1100b, 1101b, 1110b, 1111b}, that is, {4, 5, 6, 7, 12, 13, 14, 15}, is acquired is taken to introduce the method for acquiring a longest suffix mask.

The method for acquiring a longest suffix mask of an intermediate number set may be implemented by using the binary tree principle:

(1) A structure of a binary tree may be constructed in a software or hardware manner. Each node in the binary tree corresponds to one address in a memory, and each node is connected to two child nodes, so that the node is called a parent node of these two child nodes. A connection relationship between the parent node and the child nodes may be implemented by using a pointing relationship between addresses in the memory, for example, addresses of the two child nodes of the parent node are stored in the parent node, and an address of the parent node of the child nodes is stored in the child nodes. A value of each bit of a binary number may be represented by a location corresponding to the bit in a binary tree, for example, in this embodiment, the left child node of the parent node corresponds to a binary number "0", and the right child node corresponds to a binary number "1". An initial parent node in the binary tree does not correspond to any binary number, and the initial parent node is called a root node of the binary tree. Each layer under the root node of the binary tree successively corresponds to a bit of a binary number, and each layer of the binary tree from top to bottom successively corresponds to each bit of a binary number from high to low. For example, four layers in a binary tree constructed in FIG. 2 may correspond to a binary number with four bits, such as $A_3A_2A_1A_0$, where a first layer corresponds to the most significant bit $A_3$ of the binary number, and a fourth layer corresponds to the least significant bit $A_0$ of the binary number.

(2) A node corresponding to each number in the intermediate number set at the lowest layer of the binary tree is queried, and the node is set to "1".

For example, in FIG. 2, for a number 4 (that is, 0100b) of the number set {4, 5, 6, 7, 12, 13, 14, 15}, query starts from a root node of the binary tree, and it can be obtained successively that the 0100b corresponds to a left node at the first layer, corresponds to a right node at a second layer, corresponds to a left node at a third layer, and corresponds to a left node at the fourth layer; therefore, a node, which corresponds to 0100b, at the lowest layer of the binary tree is obtained, and the node may be set to "1", that is, a value stored for an address in the memory that corresponds to the node is set to "1", so as to represent that the node corresponds to a number in the intermediate number set. It should be noted that, an initial value of each node is "0". In binary trees in all embodiments of the present invention, a circle with a blank background represents a node with a value of 0, and a circle with a twill background represents a node with a value of 1.

(3) The lowest layer of the binary tree is traversed, and an AND operation is performed on values of every two child nodes having a same parent node; and if a result of the AND operation on values of two child nodes is 1, a value of a same parent node of the two child nodes is set to 1; otherwise, it is still 0.

For example, in FIG. 2, a value of a node at the third layer of the binary tree is obtained.

(4) Each layer of the binary tree is successively traversed upwards to obtain a value of a node at each layer of the binary tree.

For example, in FIG. 2, values of nodes at the second layer and the first layer are obtained.

(5) If a value of a node at a certain layer is 1, a bit corresponding to each layer under the layer (excluding the layer) is represented by using a Don't Care ("*") state, and bits corresponding to the layer and a layer above the layer are represented by using "0" or "1", so as to obtain a suffix mask used to represent the intermediate number set. If values of multiple nodes at a certain layer are 1, multiple suffix masks used for the intermediate number set can be obtained.

For example, in FIG. 2, two nodes with the values of 1 exist at the second layer, and for nodes corresponding to 4, 5, 6, and 7 at the second layer, bits corresponding to layers under a layer where the nodes are located, that is, the third layer and the fourth layer, are represented by using "*", and bits corresponding to the layer where the nodes are located and a layer above the layer are represented by using "0" or "1", so as to obtain a suffix mask 01 used to represent 4, 5, 6, and 7. Similarly, for nodes corresponding to 12, 13, 14, and 15 at the second layer, a suffix mask 11 used to represent the four numbers can be obtained.

(6) A suffix mask with the largest quantity of Don't Care bits is selected from the at least one suffix mask as the longest suffix mask of the intermediate number set.

It should be noted that, if the quantity of the at least one suffix mask is one, the one suffix mask is the longest suffix mask; if the quantity of the at least one suffix mask is at least two, and more than one suffix mask with the largest quantity of Don't Care bits exists in the at least two suffix masks, any one of the more than one suffix mask is selected as the longest suffix mask.

For example, in FIG. 2, two suffix masks 01 and 11 are obtained, and apparently, the quantities of Don't Care bits of the two suffix masks are both two; therefore, either suffix mask, for example, 01**, is selected as the longest suffix mask of the first intermediate number set, and the quantity of Don't Care bits of the longest suffix mask is 2.

Similarly, as shown in FIG. 3, a longest suffix mask 001* of the second intermediate number set is obtained, and the quantity of Don't Care bits is 1.

As shown in FIG. 4, a longest suffix mask 0001 of the third intermediate number set is obtained, and the quantity of Don't Care bits is 0.

As shown in FIG. 5, a longest suffix mask 1*** of the fourth intermediate number set is obtained, and the quantity of Don't Care bits is 3.

Finally, a longest suffix mask with the largest quantity of Don't Care bits is selected from the longest suffix masks of all the intermediate number sets as a final longest suffix mask, and the longest continuous mask of the number set is obtained according to an inverse operation of a bitwise rotation operation for obtaining an intermediate number set corresponding to the final longest suffix mask.

For example, for the number set {4, 5, 6, 7, 12, 13, 14, 15}, because the quantity of Don't Care bits of the longest suffix mask 1* of the fourth intermediate number set of the number set is 3, and apparently, the quantity of Don't Care bits of the longest suffix mask is largest, 1* is used as the final longest suffix mask. In addition, the process of obtaining the fourth intermediate number set is that bitwise left rotation by 3 bits is performed on each number in the number set, and at this time, for 1***, a longest continuous mask *1 of the number set needs to be obtained according to a bitwise rotation inverse operation, that is, bitwise right rotation by 3 bits, on 1*.

The obtaining unit 63 is configured to obtain an acquisition result according to the longest continuous mask of the number set.

The obtaining unit 63 is specifically configured to use a mask set formed by the longest continuous mask of the number set and an element in a remaining number set of the number set for the longest continuous mask as the acquisition result.

A remaining number set of a number set for a mask refers to a number set formed by remaining numbers by removing a number represented by the mask in the number set.

For example, for the number set {4, 5, 6, 7, 12, 13, 14, 15}, the longest continuous mask of the number set is *1**, and a remaining number set of the number set for the longest continuous mask is an empty set, so the obtained acquisition result is {*1**}.

Alternatively, the obtaining unit 63 is specifically configured to loop to acquire a remaining number set of a number set for a longest continuous mask of the number set and a longest continuous mask of the remaining number set, until the remaining number set is empty or the length of the longest continuous mask of the remaining number set is 0; and use a mask set formed by all obtained longest continuous masks and an element in a last remaining number set as the acquisition result.

All the longest continuous masks are the longest continuous mask of the number set and a longest continuous mask of each remaining number set obtained before the looping ends. The last remaining number set refers to a remaining number set finally obtained in the foregoing looping.

The obtaining unit may be specifically configured to acquire a remaining number set of the number set for the longest continuous mask, and acquire a longest continuous mask of the remaining number set; and if the length of the longest continuous mask of the remaining number set is 0, continue to acquire a remaining number set of the remaining number set for the longest continuous mask of the remaining number set, and perform rotation according to this, until an obtained remaining number set is an empty set or the length of the longest continuous mask of the remaining number set is 0. The mask set formed by all the longest continuous masks obtained in the foregoing process and the element in the obtained last remaining number set is used as the acquisition result.

The length of a mask refers to the quantity of Don't Care bits in the mask. For example, the length of the longest continuous mask refers to the quantity of Don't Care bits in the longest continuous mask.

For example, for a number set {0, 1, 4, 5, 6, 7, 12, 13}, a longest continuous mask of the number set is 01**, a remaining number set of the number set for the longest continuous mask of the number set is {0, 1, 12, 13}, and {0, 1, 12, 13} may be called a first remaining number set. A longest suffix mask of the first remaining number set is 000*, and a remaining number set of the first remaining number set for a longest continuous mask of the first remaining number set is {12, 13}, and {12, 13} may be called a second remaining number set. A longest continuous mask of the second remaining number set is 110*, and a remaining number set of the second remaining number set for the longest continuous mask of the second remaining number set is an empty set; at this time, the looping ends, and an obtained last remaining number set is an empty set. All longest continuous masks includes: 01**, 000*, and 110*, and the last remaining number set is an empty set; therefore, {01**, 000*, 110*} may be used as the acquisition result.

Alternatively, the obtaining unit 63 is specifically configured to loop to acquire a remaining number set of a number set for a longest continuous mask of the number set and a longest continuous mask of the remaining number set, until the remaining number set is empty or the length of the longest continuous mask of the remaining number set is 0; combine at least two continuous masks having an identical Don't Care bit in a mask set formed by all obtained longest continuous masks, that is, the longest continuous mask of the number set and a longest continuous mask of each remaining number set obtained before the looping ends, so as to obtain a combined mask set; and use a mask set formed by an element in a last remaining number set and an element in the combined mask set as the acquisition result. The last remaining number set refers to a remaining number set finally obtained in the foregoing looping. The combination may be performed for only once, or repeatedly performed until the combination cannot be performed.

The process of acquiring all the longest continuous masks may be the same as that in the foregoing description, which is not elaborated herein.

The at least two continuous masks having an identical Don't Care bit refer to that locations of all Don't Care bits in the at least two continuous masks are completely consistent. For example, all Don't Care bits of *11**, *10**, and *01** are in first, fourth, and fifth bits from left to right; therefore, *11**, *10**, and *01** have identical Don't Care bits.

The process of combining the at least two continuous masks having the identical Don't Care bit in the mask set formed by all the obtained longest continuous masks to obtain a combination result may include the following steps:

First, replace the identical Don't Care bit in at least two longest continuous masks having the identical Don't Care bit in the mask set with a same state combination of "0" and "1" to obtain at least two binary numbers.

For example, the at least two longest continuous masks having the identical Don't Care bit are 011 and 001; therefore, for the identical Don't Care bit, the identical Don't Care bit is replaced with a same state of "0" or "1", for example, two continuous Don't Care bits may be replaced with 00 to obtain two binary numbers: 01100 and 00100. These two bits may also be replaced with 01, 10, or 11.

Second, the at least two binary numbers form a number set, and a longest continuous mask of the number set is acquired as a standby longest continuous mask.

For example, binary numbers 01100 and 00100 form a number set {01100b, 00100b}, and a longest continuous mask of the number set is acquired as the standby longest continuous mask. The longest continuous mask 0*100 of the number set may be obtained as the standby longest continuous mask according to the method for acquiring a longest continuous mask that is introduced in step 102. If the length of the longest continuous mask obtained in this step is 0, a result of combining the at least two continuous masks having the identical Don't Care bit is the same as that of the at least two continuous masks that originally need to be combined, and optionally, the combination may be terminated at this time.

Finally, perform mask replacement on the standby longest continuous mask by using any one of the at least two longest continuous masks having the identical Don't Care bit to obtain a replacement result. The replacement result and an element that can be represented by the replacement result in the mask set form a combined mask set, and the combined mask set is a combination result. Any one of the at least two longest continuous masks having the identical Don't Care bit is a replacer, and the standby longest continuous mask is a replaced party.

In an actual application, because a machine can only identify a binary number of 0 or 1, representation of each mask is represented or calculated in the binary system in an actual machine, and the mask may be represented by a binary number and a positive mask or represented by a binary number and an inverse mask. For a positive mask, 1 is used to represent care, and 0 is used to represent Don't Care; on the contrary, for an inverse mask, 0 is used to represent care, and 1 is used to represent Don't Care.

If the longest continuous mask on which a replacement operation is performed is relevant to the standby longest continuous mask, that is, the standby longest continuous mask may represent a binary number of the longest continuous mask on which the replacement operation is performed, the standby longest continuous mask may also be a replacer.

When a mask is represented by a binary number and a positive mask, the mask replacement is positive mask replacement. When a mask is represented by a binary number and an inverse mask, the mask replacement is inverse mask replacement. The inverse mask replacement includes: representing a replacer and a replaced party by a binary number and an inverse mask each, performing a bitwise OR operation on two inverse masks of the replacer and the replaced party, and forming a mask by a result of the bitwise OR operation and a binary number of the replaced party. The positive mask replacement includes: representing each of a replacer and a replaced party by using a binary number and a positive mask, performing a bitwise AND operation on two positive masks of the replacer and the replaced party, and forming a mask by a result of the bitwise AND operation and a binary number of the replaced party.

An example where the inverse mask replacement is performed to obtain the combination result is taken for description in the following.

A standby longest continuous mask is, for example, 0*100, and any one of the at least two longest continuous masks having the identical Don't Care bit is, for example, 011. 011 is a replacer, and 0*100 is a replaced party. 0*100 may be represented, by a binary number and an inverse mask, as a binary number 00100 and an inverse mask 01000, and 011** may be represented, by a binary number and an inverse mask, as a binary number 01100 and an inverse mask 00011. A bitwise OR operation is performed on the two inverse masks 01000 and 00011 to obtain an inverse mask 01011, and the inverse mask 01011 and the binary number 00100 of the replaced party form a discontinuous mask 0*1. Through the foregoing operations, the masks 011 and 001** are combined into 0*1**. No mask that cannot be represented by 0*1 exists in a mask set {011, 001}; therefore, the mask set {011, 001**} is combined into {0*1**}.

Furthermore, the combination result includes a discontinuous mask, and at least two discontinuous masks have an identical Don't Care bit; therefore, the at least two discontinuous masks may be combined to obtain a combination result.

For example, if obtained discontinuous masks are 000*0** and 010*0**, with reference to the foregoing combination method, a combined mask 0*0*0** may be obtained, and {0*0*0**} is used as the combination result.

The storage unit 64 is configured to store the acquisition result in a TCAM entry corresponding to the action.

According to the apparatus for setting a TCAM entry that is provided in the embodiment of the present invention, a longest continuous mask of a number set formed by values of same fields of preset packets can be obtained by using the method for acquiring a longest continuous mask, and a TCAM entry is set according to the longest continuous mask, so as to further improve utilization of a TCAM, thereby saving TCAM resources.

Through the foregoing description of the embodiments, it is clear to a person skilled in the art that the present invention may be implemented by software plus necessary universal hardware, and definitely may also be implemented by hardware, but in many cases, the software implementation is preferred. Based on such an understanding, the technical solutions of the present invention essentially, or the part contributing to the prior art may be implemented in a form of a software product. The computer software product is stored in a readable storage medium, for example, a floppy disk, a hard disk, or an optical disc of the computer, and includes several instructions for instructing a computer device (which may be a personal computer, a server, or a network device) to perform the methods described in the embodiments of the present invention.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for setting a ternary content-addressable memory (TCAM) entry, comprising:
    acquiring a number set formed by values of a same field in at least two packets, wherein the packets undergo a same action, and the number set comprises at least two numbers;
    acquiring a longest continuous mask of the number set, wherein the longest continuous mask is a continuous mask with a largest quantity of Don't Care bits in all continuous masks in all masks of the number set, each of the continuous masks is a mask of continuous Don't Care bit or a mask of the continuous Don't Care bit after the mask undergoes a bitwise rotation operation, each of the masks of the number set is an element in a first mask set of the number set, the first mask set of the number set is a group of masks that can match all elements in the number set and do not match any number except the elements in the number set;

obtaining an acquisition result according to the longest continuous mask of the number set; and storing the acquisition result in the TCAM entry corresponding to the same action;

wherein acquiring the longest continuous mask comprises:

performing a first bitwise rotation operation on all elements in the number set to acquire a first bitwise rotation operated number set, changing the first bitwise rotation operation to a second bitwise rotation operation, performing the second bitwise rotation operation on all elements in the number set to acquire a second bitwise rotation operated number set, and repeating the changing and performing a same bitwise rotation operation on all elements in the number set until all possible bitwise rotation operations are performed to acquire all bitwise rotation operated number sets;

acquiring longest suffix masks of all the bitwise rotation operated number sets, wherein a longest suffix mask is a suffix mask, in all suffix masks of the all bitwise rotation operated number sets, with a largest quantity of Don't Care bits, each of suffix masks is a continuous mask of which least significant bit is in a Don't Care state; and performing a corresponding bitwise rotation inverse operation on the longest suffix mask to acquire the longest continuous mask, wherein the corresponding bitwise rotation inverse operation is an inverse operation of the bitwise rotation operation to obtain the longest suffix mask from the number set.

2. The method for setting a TCAM entry according to claim 1, wherein the obtaining the acquisition result according to the longest continuous mask of the number set comprises:

using a second mask set including only the longest continuous mask of the number set and an element in a remaining number set of the number set for the longest continuous mask as the acquisition result, wherein the remaining number set of the number set for the longest continuous mask is a set including only remaining numbers with no number represented by the longest continuous mask in the number set.

3. The method for setting a TCAM entry according to claim 1, wherein the obtaining the acquisition result according to the longest continuous mask of the number set comprises:

acquiring a remaining number set of the number set for the longest continuous mask of the number set;

acquiring a longest continuous mask of the remaining number set;

repeating the above two processes to obtain a new remaining number set and a new longest continuous mask until the remaining number set is empty or a length of the longest continuous mask of the remaining number set is 0;

using a third mask set including only all obtained longest continuous masks and an element in a last remaining number set as the acquisition result.

4. The method for setting a TCAM entry according to claim 1, wherein the obtaining the acquisition result according to the longest continuous mask of the number set comprises:

acquiring a remaining number set of the number set for the longest continuous mask of the number set;

acquiring a longest continuous mask of the remaining number set;

repeating the above two processes to obtain a new remaining number set and a new longest continuous mask until the remaining number set is empty or a length of the longest continuous mask of the remaining number set is 0;

combining at least two continuous masks having an identical Don't Care bit in a forth mask set including only all obtained longest continuous masks to obtain a combined mask set, wherein a combining result of the at least two continuous masks having the identical Don't Care bit is a combining result mask having the identical Don't Care bit with the at least two continuous masks, and a same non-Don't Care bit of the at least two masks remains unchanged, and at least one different non-Don't Care bit of the at least two masks is replaced by a Don't Care bit; and using a fifth mask set including only an element in a last remaining number set and an element in the combined mask set as the acquisition result.

5. A network device, comprising a processor and a ternary content-addressable memory (TCAM), wherein, the TCAM is configured to store multiple TCAM entries;

the processor is configured to:

acquire a number set formed by values of a same field in at least two packets, wherein the packets undergo a same action, and the number set comprises at least two numbers;

acquire a longest continuous mask of the number set, wherein the longest continuous mask is a continuous mask with a largest quantity of Don't Care bits in all continuous masks in all masks of the number set, each of the continuous masks is a mask of continuous Don't Care bit or a mask of the continuous Don't Care bit after the mask undergoes a bitwise rotation operation, each of the masks of the number set is an element in a first mask set of the number set, the first mask set of the number set is a group of masks that can match all elements in the number set and do not match any number except the elements in the number set;

obtain an acquisition result according to the longest continuous mask of the number set; and instruct the TCAM to store the acquisition result in a TCAM entry corresponding to the action;

wherein acquiring the longest continuous mask comprises:

performing a first bitwise rotation operation on all elements in the number set to acquire a first bitwise rotation operated number set, changing the first bitwise rotation operation to a second bitwise rotation operation, performing the second bitwise rotation operation on all elements in the number set to acquire a second bitwise rotation operated number set, and repeating the changing and performing a same bitwise rotation operation on all elements in the number set until all possible bitwise rotation operations are performed to acquire all bitwise rotation operated number sets;

acquiring longest suffix masks of all the bitwise rotation operated number sets, wherein a longest suffix mask is a suffix mask, in all suffix masks of the all bitwise rotation operated number sets, with a largest quantity of Don't Care bits, each of suffix masks is a continuous mask of which least significant bit is in a Don't Care state; and performing a corresponding bitwise rotation inverse operation on the longest suffix mask to acquire the longest continuous mask, wherein the corresponding bitwise rotation inverse operation is an inverse operation of the bitwise rotation operation to obtain the longest suffix mask from the number set.

6. The network device according to claim 5, wherein the processor is configured to use a second mask set including only the longest continuous mask of the number set and an element in a remaining number set of the number set for the longest continuous mask as the acquisition result, wherein the remaining number set of the number set for the longest continuous mask is a set including only remaining numbers with no number represented by the longest continuous mask in the number set.

7. The network device according to claim 5, wherein the processor is configured to:
acquire a remaining number set of the number set for the longest continuous mask of the number set;
acquire a longest continuous mask of the remaining number set;
repeating the above two processes to obtain new remaining number set and a new longest continuous mask until the remaining number set is empty or a length of the longest continuous mask of the remaining number set is 0;
use a third mask set including only all obtained longest continuous masks and an element in a last remaining number set as the acquisition result.

8. The network device according to claim 5, wherein the processor is configured to:
acquire a remaining number set of the number set for the longest continuous mask of the number set;
acquire a longest continuous mask of the remaining number set;
repeating the above two processes to obtain a new remaining number set and a new longest continuous mask until the remaining number set is empty or a length of the longest continuous mask of the remaining number set is 0;
combine at least two continuous masks having an identical Don't Care bit in a forth mask set including only all obtained longest continuous masks to obtain a combined mask set, wherein a combining result of the at least two continuous masks having the identical Don't Care bit is a combining result mask having the identical Don't Care bit with the at least two continuous masks, and a same non-Don't Care bit of the at least two masks remains unchanged, and at least one different non-Don't Care bit of the at least two masks is replaced by a Don't Care bit; and
use a fifth mask set including only an element in a last remaining number set and an element in the combined mask set as the acquisition result.

9. A non-transitory computer-readable medium storing programming instructions which instruct a processor to perform steps comprising:
acquiring a number set formed by values of a same field in at least two packets, wherein the packets undergo a same action, and the number set comprises at least two numbers;
acquiring a longest continuous mask of the number set, wherein the longest continuous mask is a continuous mask with a largest quantity of Don't Care bits in all continuous masks in all masks of the number set, each of the continuous masks is a mask of continuous Don't Care bit or a mask of the continuous Don't Care bit after the mask undergoes a bitwise rotation operation, each of the masks of the number set is an element in a first mask set of the number set, the first mask set of the number set is a group of masks that can match all elements in the number set and do not match any number except the elements in the number set;
obtaining an acquisition result according to the longest continuous mask of the number set; and
storing the acquisition result in the TCAM entry corresponding to the same action;
wherein acquiring the longest continuous mask comprises:
performing a first bitwise rotation operation on all elements in the number set to acquire a first bitwise rotation operated number set, changing the first bitwise rotation operation to a second bitwise rotation operation, performing the second bitwise rotation operation on all elements in the number set to acquire a second bitwise rotation operated number set, and repeating the changing and performing a same bitwise rotation operation on all elements in the number set until all possible bitwise rotation operations are performed to acquire all bitwise rotation operated number sets;
acquiring longest suffix masks of all the bitwise rotation operated number sets wherein a longest suffix mask is a suffix mask, in all suffix masks of the all bitwise rotation operated number sets, with a largest quantity of Don't Care bits, each of suffix masks is a continuous mask of which least significant bit is in a Don't Care state; and
performing a corresponding bitwise rotation inverse operation on the longest suffix mask to acquire the longest continuous mask, wherein the corresponding bitwise rotation inverse operation is an inverse operation of the bitwise rotation operation to obtain the longest suffix mask from the number set.

10. The non-transitory computer-readable medium according to claim 9, wherein the obtaining the acquisition result according to the longest continuous mask of the number set comprises:
using a second mask set including only the longest continuous mask of the number set and an element in a remaining number set of the number set for the longest continuous mask as the acquisition result, wherein the remaining number set of the number set for the longest continuous mask is a set including only remaining numbers with no number represented by the longest continuous mask in the number set.

11. The non-transitory computer-readable medium according to claim 9, wherein the obtaining the acquisition result according to the longest continuous mask of the number set comprises:
acquiring a remaining number set of the number set for the longest continuous mask of the number set;
acquiring a longest continuous mask of the remaining number set;
repeating the above two processes to obtain new remaining number set and new longest continuous mask until the remaining number set is empty or a length of the longest continuous mask of the remaining number set is 0;
using a third mask set including only all obtained longest continuous masks and an element in a last remaining number set as the acquisition result.

12. The non-transitory computer-readable medium according to claim 9, wherein the obtaining the acquisition result according to the longest continuous mask of the number set comprises:
acquiring a remaining number set of the number set for the longest continuous mask of the number set;
acquiring a longest continuous mask of the remaining number set;
repeating the above two processes to obtain new remaining number set and new longest continuous mask until the remaining number set is empty or a length of the longest continuous mask of the remaining number set is 0;

combining at least two continuous masks having an identical Don't Care bit in a forth mask set including only all obtained longest continuous masks to obtain a combined mask set, wherein a combining result of the at least two masks having an identical Don't Care bit is a combining result mask having the identical Don't Care bit with the at least two masks, and a same non-Don't Care bit of the at least two masks remains unchanged, and at least one different non-Don't Care bit of the at least two masks is replaced by a Don't Care bit; and using a fifth mask set including only an element in a last remaining number set and an element in the combined mask set as the acquisition result.

* * * * *